United States Patent [19]

Chow et al.

[11] Patent Number: 4,789,648

[45] Date of Patent: Dec. 6, 1988

[54] METHOD FOR PRODUCING COPLANAR MULTI-LEVEL METAL/INSULATOR FILMS ON A SUBSTRATE AND FOR FORMING PATTERNED CONDUCTIVE LINES SIMULTANEOUSLY WITH STUD VIAS

[75] Inventors: Melanie M. Chow, Poughquag, N.Y.; John E. Cronin, Milton, Vt.; William L. Guthrie, Hopewell Junction, N.Y.; Carter W. Kaanta, Essex Junction, Vt.; Barbara Luther, Devon, Pa.; William J. Patrick, Newburgh, N.Y.; Kathleen A. Perry, Lagrangeville, N.Y.; Charles L. Standley, Wappingers Falls, N.Y.

[73] Assignee: International Business Machines Corporation, Armonk, N.Y.

[21] Appl. No.: 791,887

[22] Filed: Oct. 28, 1985

[51] Int. Cl.4 .................. H01L 21/304; H01L 21/306
[52] U.S. Cl. .................................... 437/225; 437/228; 437/238; 437/245; 437/246; 437/195; 156/653
[58] Field of Search .............. 29/591, 577 C; 156/636, 156/653; 357/71; 437/225, 228, 238, 245, 246, 235, 189, 195

[56] References Cited

U.S. PATENT DOCUMENTS

| | | | |
|---|---|---|---|
| 2,933,437 | 4/1960 | Loosme | 156/636 |
| 3,911,562 | 10/1975 | Youmans | 29/580 |
| 4,305,779 | 12/1981 | Steeves et al. | 156/636 |
| 4,366,613 | 1/1983 | Ogura et al. | 29/571 |
| 4,475,981 | 10/1984 | Rea | 156/636 |
| 4,508,815 | 4/1985 | Ackmann et al. | 156/653 |
| 4,526,631 | 7/1985 | Silvestri et al. | 156/648 |

OTHER PUBLICATIONS

Ghandhi, S. K., "VLSI Fabrication Principles", 1983, pp. 582-585.

Primary Examiner—Brian E. Hearn
Assistant Examiner—Kevin McAndrews
Attorney, Agent, or Firm—Robert J. Haase; John A. Stemwedel

[57] ABSTRACT

Patterned conductive lines are formed simultaneously with stud via connections through an insulation layer to previously formed underlying patterned conductive lines in multilevel VLSI chip technology. A first planarized layer of insulation is deposited over a first level of patterned conductive material to which contacts are to be selectively established. The first layer then is covered by an etch stop material. Contact holes are defined in the etch stop material at locations where stud connectors are required. The first layer of insulation is not etched at this time.

Next, a second planarized layer of insulation, is deposited over the etch stop material. The second layer insulation, in turn, is etched by photolithography down to the etch stop material to define desired wiring channels, some of which will be in alignment with the previously formed contact holes in the etch stop material. In those locations where the contact holes are exposed, the etching is continued into the first layer of insulation to uncover the underlying first level of patterned conductive material.

The channels and via holes are overfilled with metallization. The excess metallization is removed by etching or by chem-mech (chemical-mechanical) polishing.

6 Claims, 2 Drawing Sheets

METHOD FOR PRODUCING COPLANAR MULTI-LEVEL METAL/INSULATOR FILMS ON A SUBSTRATE AND FOR FORMING PATTERNED CONDUCTIVE LINES SIMULTANEOUSLY WITH STUD VIAS

BACKGROUND OF THE INVENTION

1. Field of the Invention

The present invention relates to the manufacture of high performance VLSI semiconductor chips in general and, more particularly, to a method for producing coplanar multi-level metal/insulator films on a substrate according to a chem-mech polishing technique by which conductive lines as well as stud via metal contacts are simultaneously formed.

2. Description of Prior Art

A semiconductor chip consists of an array of devices whose contacts are interconnected by patterns of wiring metal stripes. In VLSI chips, these metal patterns are multi-layered and separated by layers of insulating material. Interconnections between different levels of metal wiring patterns are made by holes (or via holes), which are etched through said layers of insulating material. Typical chip designs consist of one or two wiring levels, with three wiring levels being the current state of the art. Circuit cost and performance requirements continue to place demands on the fabrication processes in such a way that the addition of supplementary wiring levels must remain competitive even though additional processing steps are involved. However, the existing technique of using via-holes has multiple limitations and drawbacks in that, as the number of metallization layers increases, wiring becomes increasingly difficult, as may be clearly understood from FIG. 1.

The semiconductor structure 10 shown in FIG. 1 is a typical example of said current state of the art technlogy. It is comprised of a silicon substrate 11 of a predetermined conductivity type having a patterned first insulating layer 12 of silicon dioxide (SiO₂) thereon. The first level of metallization is represented by a metal land 13 which makes contact through via hole 14 with a region 15 of the substrate. It makes contact, for example as an ohmic contact, with the emitter region of a bipolar transistor (not represented).

The second level of metallization represented by metal land 16 makes an electrical contact with metal land 13 through via hole 17 of the second insulating layer 18. The structure is passivated with a third insulating layer 19. Although the structure depicted in FIG. 1 is not to scale, it exemplifies the very irregular surface, far from planar, which results from the standard process.

With such a non-planar structure, the known problems are: first a risk of a potential short at location A between the first and second levels of metallization, due to the thinning of the insulating layer therebetween, and second the risk of a potential open circuit at location B, due to the thinning of the metal layer at that location (so called necking effect). Those risks are unacceptable for the high standard of reliability which are required in that industry. Therefore there is a present and serious need to improve the via-hole technique to solve the acute problem of planarizing such irregular surfaces.

Separate processes typically are used for making a given patterned metal level and for making stud via connections from the given level to a latter formed overlying patterned metal level. One example of such processes is described in Process for Multilayer Metal Technology, by G. T. Chiu et al., IBM Technical Disclosure Bulletin, Vol. 25, No. 10, March 1983, pg. 5309. According to the described technique, a lower level metal contact or conductive pattern is formed in an insulator layer, stud connectors are fabricated at selected locations of the lower level metal pattern, insulator material is placed about the stud connectors, an overlying insulator layer is deposited and patterned, and an upper level metal or other conductive pattern is placed in the overlying insulator layer. Not only is the cited technique complicated and costly but the planarization of the individual metal and stud levels is difficult to accomplish.

SUMMARY OF THE INVENTION

Patterned conductive lines are formed simultaneously with stud vias in a simplified multi-level/insulator process for interconnecting VLSI chip components. A first planarized layer of insulation is deposited over a first level of patterned conductive material to which contacts are to be selectively established. The first layer then is covered by an etch stop material. Contact holes are defined in the etch stop material using conventional photolithography at locations where stud connectors are required. The thickness of the first layer of insulation is made equal to the desired stud height. The first layer of insulation is not etched at this time.

Next, a second planarized layer of insulation, having a thickness equal to the thickness of the second level of patterned conductive material of the multi-level structure, is deposited over the etch stop material. The second layer insulation, in turn, is etched by photolithography down to the etch stop material to define desired wiring channels, some of which will be in alignment with the previously formed contact holes in the etch stop material. In those locations where the contact holes are exposed, the etching is continued into the first layer of insulation to uncover the underlying first level of patterned conductive material.

The channels and via holes etched into the second and first layers of insulation, respectively, are overfilled with metallization. The excess metallization, on top of the second layer of insulation but not in the channels or via holes is removed by etching or by chem-mech (chemical-mechanical) polishing. In the case of etching, the same tool used for the deposition of the overfilled metallization can be adapted for in-situ plasma mode etching of the excess metallization. Chem-mech polishing can be achieved following the teachings of copending patent application Ser. No. 791,860, 10-28-85.

DETAILED DESCRIPTION OF THE PREFERRED EMBODIMENT

Figure 1:
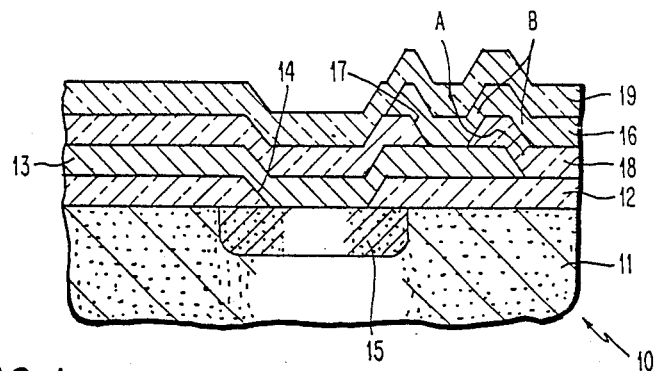
FIG. 1 shows a schematic cross-sectional view of a multilayered metal semiconductor structure fabricated according to standard processes and exhibiting a typical non-planar surface.
Figure 2:
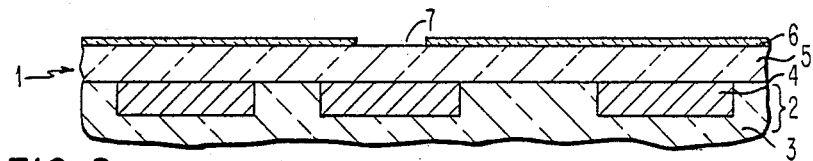
FIGS. 2–6 are a series of simplified cross-sectional views of the formation of coplanar multi-level metal/insulator films of a substrate resulting at successive stages during the course of the method of the present invention.

FIG. 2 shows a structure 1 which typically includes a substrate 2 consisting of a first planarized layer 3 of dielectric material deposited over a first level 4 of patterned conductive material. In a general case, conductors 4 may or may not penetrate fully through insulation 3 which, in turn, is located over an integrated circuit chip. In the former instance conductors 4 would be contact metallurgy to devices (not shown) formed in the chip. In the latter instance (shown) conductors 4 would be a level of metallization insulated from the chip surface. As is well understood, insulation 3 commonly comprises planarized $SiO_2$ or reflowed phosphosilicate glass whereas conductors 4 typically are copper-doped aluminum or doped polycrystalline silicon. The specific nature of insulation 3 and conductors 4 is not of moment to the present invention.

A first planarized layer of insulation 5, such as sputtered quartz, is deposited over substrate 2 in a thickness equal to the desired height of stud via connections.

Figure 3:
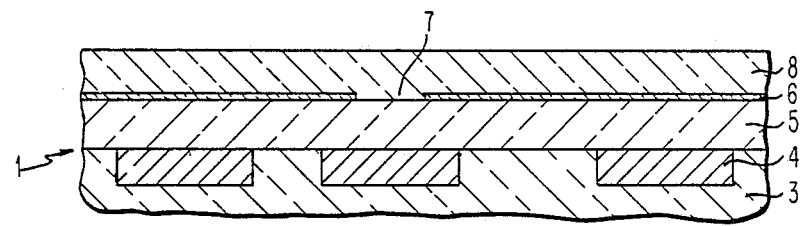

A thin layer of etch stop material 6, such as aluminum oxide, is deposited and patterned so as to provide a window 7 at each location where a stud via connection is to be formed between underlying metallization level 4 and an overlying metallization level (not shown in FIG. 2) to be deposited later. In preparation for the overlying metallization level, a second planarization layer of insulation 8, for example sputtered quartz or a composite $Si_3N_4/SiO_2$ layer (deposited by CVD), is placed down, as shown in FIG. 3, over the structure shown in FIG. 2. The thickness of layer 8 determines the thickness of an overlying level of metallization to be formed in channels to be etched completely through layer 8.

Figure 4:
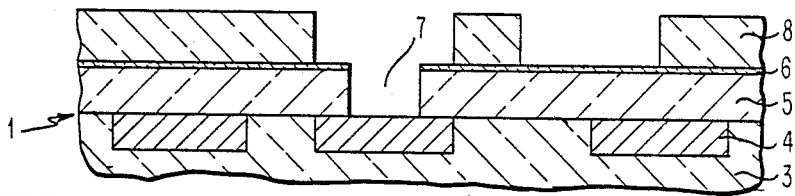

Channels are defined by standard photolithography in a resist layer (not shown) over layer 8. In places where a stud via connection to underlying metallization 4 is desired, the respective channel opening in layer 8 must be aligned with a hole (such as hole 7) in etch stop layer 6. To facilitate the alignment, the channel width is wider than the hole, as shown in FIG. 4. The etching of the layer 8 terminates at the etch stop layer where no via is needed. In the case where the layer 8 is sputtered quartz and the etch stop layer is $Al_2O_3$, reactive ion etching using $CF_4/O_2$ is appropriate.

Figure 5:
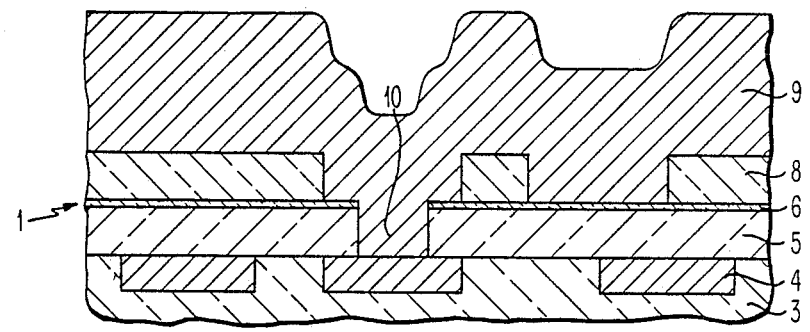

After the channels are defined, an overlying level of metallization 9, e.g., Al-Cu, Al-Si or Tungsten is deposited over the structure of FIG. 4 as shown in FIG. 5. The thickness of metallization 9 is at least as great as the height of the stud via connection 10 (equal to the thickness of layers 5 and 6) plus the thickness of the underlying metallization 5. In the event that layer 5 is CVD Tungsten, the same tool used to deposit the Tungsten also can be used to etch it back in situ in a plasma mode so as to coplanarize the surfaces of layers 8 and 9. Alternatively, layer 9 may be planarized by the chem-mech method taught in copending patent application Ser. No. 791,860, filed Oct. 28, 1985, entitled "Chem-Mech Polishing Method for Producing Coplanar Metal/Insulator Films on a Substrate" by K. D. Beyer et al. The result is shown in FIG. 6.

Briefly, as taught in said copending patent application, the method of chem-mech polishing comprises the concurrent chemical and mechanical polishing of an overlying first layer to expose the surface of a non-planar second layer on which the first layer is formed. One of the layers is a conductive film and the other layer is an insulator film. The polishing takes place using a polishing pad and a slurry which removes the first layer at a faster rate than the second layer until the upper surface of the overlying material becomes coplanar with the upper surface of the initially covered second layer.

A final thin passivation insulator is required on top of the metal pattern 9 if it is the final metal level. If the wiring level of pattern 9 is to be followed by one or more additional wiring levels, then the above described stud via and overlying metallization steps plus the associated insulation layer steps are repeated for each additional wiring level.

Figure 6:
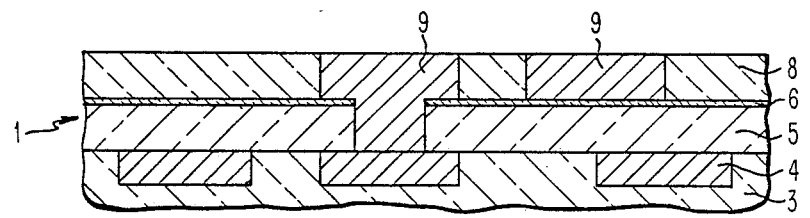

Although the preferred method described with the aid of FIGS. 2–6 makes use of etch stop layer 6 and insulation layers 5 and 8, the method may be practiced satisfactorily without the extra steps associated therewith. Instead, a single insulation layer having a thickness equal to the sum of layers 5 and 8 can be deposited on substrate 2. Then, the same photolithography can be used (as produced the pattern in insulator 8 of FIG. 4) while stopping the etching of the single insulator layer when the desired depth for conductors 9 of FIG. 6 is reached. The additional etching of the single insulation layer (to open stud via holes where required) can be accomplished by additional photolithography corresponding to that used to open hole 7 of FIG. 2. The same metallization and planarization steps of FIGS. 5 and 6 can then be applied.

Although the preferred embodiment also makes use of sputtered quartz or composite $Si_3N_4//SiO_2$ for insulation layers 5 and 8, other insulation materials, such as spin-on polyimides, also are suitable. Compatible etch stop layer materials include spin-on glass and plasma nitride where polyimide insulation is used.

While the invention has been particularly shown and described with reference to preferred embodiments thereof, it will be understood by those skilled in the art that various changes in form and detail may be made therein without departing from the spirit and scope of the invention.

What is claimed is:

1. A method for producing multi-level coplanar metal/insulator films characterized by the formation of an overlying metallization and the simultaneous formation of a stud via connection through an intervening insulator which comprises a first insulator layer, an etch stop layer, and a second insulator layer to an underlying patterned metallization, said method comprising the steps of:

providing a substrate having said underlying metallization therein;

placing said insulator on said substrate;

selectively removing first portions on said insulator at first locations where said overlying metallization is desired, said first portions partially penetrating through said insulator;

selectively removing second portions of said insulator at second locations where each said stud via connection is desired, said second portions penetrating fully through the remainder of said insulator;

said second portions being in alignment with some of said first portions;

simultaneously depositing metal over said insulator to form said overlying metallization in said first locations and stud via connections in said second locations, and removing any of said metal which overlies said insulator at locations other than said first locations by a chemical-mechanical polishing technique to copolanarize the surfaces of said stud via connection, said overlying metallization, and said insulator.

2. The method defined in claim 1 wherein said first portions are removed from said second insulator layer, and
    said second portions are removed from said etch stop layer and said first insulator layer,
    said first layer being adjacent said substrate.

3. The method defined in claim 2 wherein said first insulator and second insulator layers are quartz, and said etch stop layer is $Al_2O_3$.

4. The method defined in claim 2 wherein said first insulator layer is selected from the group comprised of sputtered quartz, phosphosilicate glass and polyimide,
    said second insulator layer is selected from the group comprised of quartz, polyimide and a composite consisting of $Si_3N_4$ and $SiO_2$, and
    said metal is selected from the group comprised of Al-Cu, Al-Si and Tungsten.

5. The method defined in claim 1 wherein said steps other than said step of providing said substrate are repeated in sequence a desired number of times.

6. The method defined in claim 1 wherein said insulator layers are planarized.

* * * * *